United States Patent
Jeong et al.

(10) Patent No.: US 11,228,283 B2
(45) Date of Patent: Jan. 18, 2022

(54) NEGATIVE IMPEDANCE CIRCUIT FOR REDUCING AMPLIFIER NOISE

(71) Applicant: MEDIATEK Singapore Pte. Ltd., Singapore (SG)

(72) Inventors: Taehoon Jeong, San Jose, CA (US); Patrick Cooney, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/840,537

(22) Filed: Apr. 6, 2020

(65) Prior Publication Data

US 2020/0321919 A1    Oct. 8, 2020

Related U.S. Application Data

(60) Provisional application No. 62/830,639, filed on Apr. 8, 2019.

(51) Int. Cl.
   *H03F 1/26*  (2006.01)
   *H03F 1/30*  (2006.01)
   *H03F 3/45*  (2006.01)

(52) U.S. Cl.
   CPC ............. *H03F 1/26* (2013.01); *H03F 1/301* (2013.01); *H03F 3/45183* (2013.01); *H03F 2203/45276* (2013.01)

(58) Field of Classification Search
   CPC ...................................................... H03F 1/26
   See application file for complete search history.

(56) References Cited

U.S. PATENT DOCUMENTS

| 4,001,735 | A | 1/1977 | Cheng et al. |
| 8,963,641 | B1 | 2/2015 | Liu |
| 9,621,136 | B1 | 4/2017 | Chang |
| 10,003,374 | B1* | 6/2018 | Lee ............ H03F 3/19 |
| 2003/0034849 | A1 | 2/2003 | Sanduleanu |
| 2005/0195672 | A1* | 9/2005 | Lee ............ G11C 7/04 365/207 |
| 2006/0114044 | A1* | 6/2006 | Mintchev ............ H03H 11/265 327/261 |

(Continued)

FOREIGN PATENT DOCUMENTS

| EP | 0 768 533 B1 | 6/2002 |
| TW | 544995 B | 8/2003 |

(Continued)

OTHER PUBLICATIONS

Extended European Search Report dated Sep. 8, 2020 for European Application No. EP 20168573.2.

(Continued)

*Primary Examiner* — Patricia T Nguyen
(74) *Attorney, Agent, or Firm* — Wolf, Greenfield & Sacks, P.C.

(57) ABSTRACT

A circuit includes a first operational amplifier having an inverting input and a non-inverting input, and a negative resistance circuit connected to the inverting input of the operational amplifier. The negative resistance circuit includes a second operational amplifier, a current source controlled by the second operational amplifier, and a cross-coupled transistor circuit having at least one transistor biased by a current produced by the current source.

20 Claims, 6 Drawing Sheets

(56) References Cited

U.S. PATENT DOCUMENTS

| | | | |
|---|---|---|---|
| 2009/0010054 | A1 | 1/2009 | Kang et al. |
| 2011/0241646 | A1* | 10/2011 | Vyne .................. G05F 3/30 323/313 |
| 2013/0136211 | A1* | 5/2013 | Jussila ................ H04B 1/0075 375/340 |
| 2016/0156318 | A1 | 6/2016 | Vinayak |
| 2018/0138860 | A1 | 5/2018 | Zhang |
| 2020/0257946 | A1* | 8/2020 | Kananian ........... G06K 19/0672 |

FOREIGN PATENT DOCUMENTS

| | | |
|---|---|---|
| TW | 200726070 A | 7/2007 |
| WO | WO 03/017487 A1 | 2/2003 |

OTHER PUBLICATIONS

Boutin N. Active compensation of op-amp inverting amplifier using NIC. Electronics Letters. Dec. 10, 1981;17(25):978-9.

Chen et al., Novel constant transconductance references and the comparisons with the traditional approach. Southwest Symposium on Mixed-Signal Design. Feb. 25, 2003:104-7.

Jang et al., A 55μW 93.1 dB-DR 20kHz-BW single-bit CT ΔΣ modulator with negative R-assisted integrator achieving 178.7 dB FoM in 65nm CMOS. IEEE Symposium on VLSI Circuits Jun. 5, 2017:40-1.

Lee et al., A 1.2 V 68μW 98.2dB-DR audio continuous-time delta-sigma modulator. IEEE Symposium on VLSI Circuits Jun. 18, 2018:199-200.

Mahrof et al., Cancellation of OpAmp virtual ground imperfections by a negative conductance applied to improve RF receiver linearity. IEEE Journal of Solid-State Circuits. May 1, 2014:49(5):1112-24.

Talebbeydokhti et al., Constant transconductance bias circuit with an on-chip resistor. IEEE International Symposium on Circuits and Systems May 21, 2006:2857-60.

Wang et al., A 0.0004%(− 108dB) THD+ N, 112dB-SNR, 3.15 W fully differential Class-D audio amplifier with G m noise cancellation and negative output-common-mode injection techniques. IEEE International Solid-State Circuits Conference-(ISSCC) Feb. 11, 2018:58-60.

EP 20168573.2, Sep. 8, 2020, Extended European Search Report.

\* cited by examiner

NEGATIVE IMPEDANCE CIRCUIT FOR REDUCING AMPLIFIER NOISE

CROSS-REFERENCE TO RELATED APPLICATIONS

This application claims priority to U.S. provisional application Ser. No. 62/830,639, filed Apr. 8, 2019, titled "NOISE REDUCTION TECHNIQUE WITH NEGATIVE RESISTANCE AT SUMMING JUNCTION," which is hereby incorporated by reference in its entirety.

BACKGROUND

1. Technical Field

The techniques described herein relate generally to negative resistance circuits for reducing noise in operational amplifiers, including in audio applications, for example.

2. Discussion of the Related Art

An operational amplifier or "op-amp" is a widely used amplifier circuit. An operational amplifier has an "inverting input" denoted by the symbol "−" and a non-inverting input denoted by the symbol "+". The inputs of an operational amplifier have a high input impedance. The output of the operational amplifier has a low output impedance. One or more components may be connect between the input(s) and the output. An operational amplifier uses feedback to drive the inverting and non-inverting inputs to the same voltage, also termed a virtual short.

SUMMARY

A circuit includes a first operational amplifier having an inverting input and a non-inverting input; a negative resistance circuit connected to the inverting input of the first operational amplifier, the negative resistance circuit comprising: a second operational amplifier; a current source controlled by the second operational amplifier; and a cross-coupled transistor circuit having at least one transistor biased by a current produced by the current source.

The at least one transistor may have a source connected to a non-inverting input of the second operational amplifier.

The cross-coupled transistor circuit may comprise a first transistor; and a second transistor. A gate of the first transistor may be connected to a drain of the second transistor and a gate of the second transistor may be connected to a drain of the first transistor.

A source of the first transistor and a source of the second transistor may be connected to a non-inverting input of the second operational amplifier.

The first transistor may have a drain connected to the inverting input of the first operational amplifier and the second transistor may have a drain connected to a ground terminal or a differential input.

The circuit may further comprise a second cross-coupled transistor circuit having at least one transistor biased by a current produced by a second current source, the second current source being controlled by the second operational amplifier.

The second cross-coupled transistor circuit may comprise a third transistor; and a fourth transistor, wherein a gate of the third transistor is connected to a drain of the fourth transistor and a gate of the fourth transistor is connected to a drain of the third transistor.

A source of the third transistor and a source of the fourth transistor may be connected to a non-inverting input of the second operational amplifier.

The circuit may further comprise a first impedance coupled between the third transistor and ground, and a second impedance coupled between the fourth transistor and ground.

The circuit may further comprise a first transistor having its source connected to an inverting input of the second operational amplifier; and a second transistor having its source connected to a non-inverting input of the second operational amplifier. The first and second transistors each may have their gate connected to their drain.

The circuit may further comprise a third current source controlled by the second operational amplifier and biasing the first transistor; and a fourth current source controlled by the second operational amplifier and biasing the second transistor.

The circuit may further comprise an impedance coupled between the first transistor and a ground terminal.

The second transistor may have its drain connected to a ground terminal.

The circuit may have an impedance connected between the sources of the first and second transistors.

A negative resistance circuit may include an operational amplifier; a current source controlled by the operational amplifier; and a cross-coupled transistor circuit having at least one transistor biased by a current produced by the current source.

The at least one transistor may have a source connected to a non-inverting input of the operational amplifier.

The cross-coupled transistor circuit may comprise a first transistor; and a second transistor. A gate of the first transistor may be connected to a drain of the second transistor and a gate of the second transistor may be connected to a drain of the first transistor.

A source of the first transistor and a source of the second transistor may be connected to a non-inverting input of the operational amplifier.

The negative resistance circuit may further comprise a first transistor having its source connected to an inverting input of the operational amplifier; and a second transistor having its source connected to a non-inverting input of the operational amplifier. The first and second transistors may each have their gate connected to their drain.

The negative resistance circuit may further comprise a third current source controlled by the operational amplifier and biasing the first transistor; and a fourth current source controlled by the operational amplifier and biasing the second transistor.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Op-amps have internal noise that may appear in the output signal. Although an op-amp may be designed to have reduced internal noise, doing so may increase power dissipation. Accordingly, it is desirable to use a different technique to reduce the internal noise appearing in the output signal.

Figure 1:
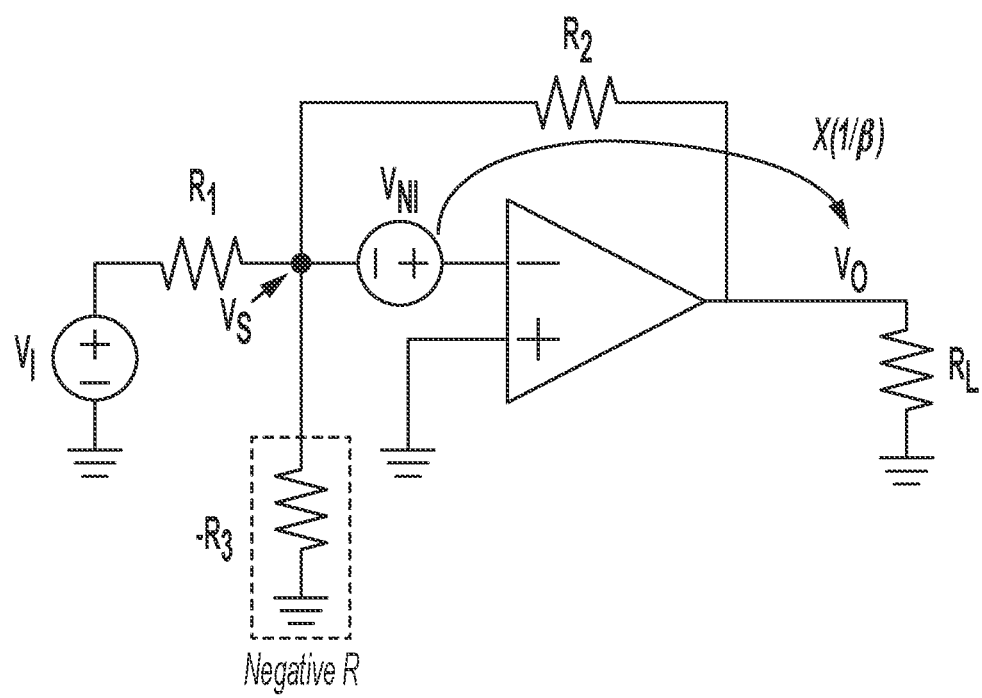
FIG. 1 illustrates that the internal noise of an operational amplifier may be modeled as a voltage source in series with the non-inverting input.

It has been appreciated that a shunt negative resistance value between the non-inverting input and ground can at least partially cancel the internal noise of the op-amp. FIG. 1 illustrates that the internal noise may be modeled as a voltage source $V_{NI}$ in series with the non-inverting input. The shunt negative resistance (−R3) produces a current of suitable polarity that flows through resistor R2 to the output, and at least partially cancels the external noise.

Figure 2:
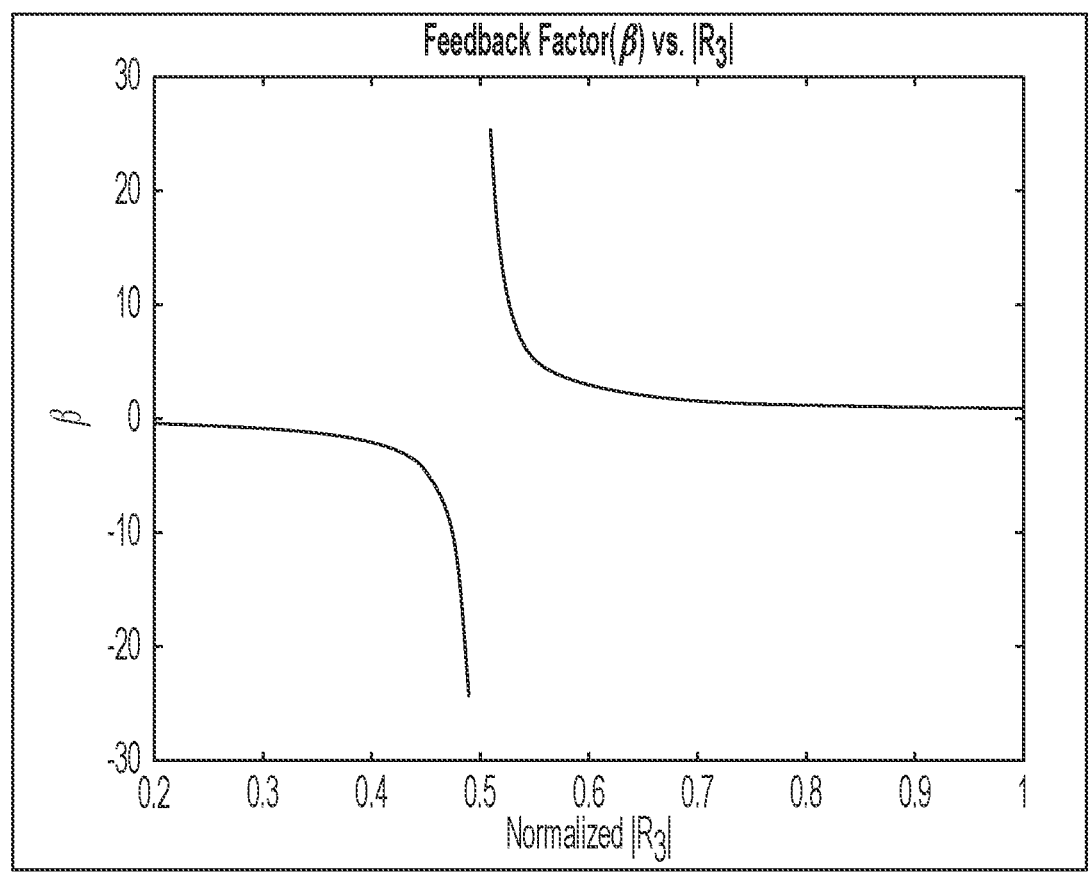
FIG. 2 illustrates the feedback factor beta over a range of values of normalized absolute value of $R_3$.

One challenge with such an approach is the optimum value of negative resistance to cancel the internal noise of the operational amplifier can cause the circuit to become unstable. FIG. 2 illustrates that the optimized normalized value of |R₃| is 0.5, with the feedback factor (β) going to infinity or negative infinity on either side of 0.5, which indicates the circuit is unstable at |R₃|=0.5. Therefore, it is desirable to have the negative resistance value be close to but not equal to the optimal value for canceling the internal noise. One challenge with setting the negative resistance value close to the value that causes the circuit to go unstable is that variations in the component values due to process voltage or temperature (PVT variations) can result in the negative resistance value drifting to the value at which the circuit goes unstable. Accordingly, would be desirable for the negative resistance circuit to be insensitive to PVT variations.

The circuits described herein produce a small signal negative resistance value and are insensitive to PVT variations. In some embodiments, cross-coupled transistors may be included that are constant-$G_m$ biased in strong inversion or weak inversion.

Figure 3:
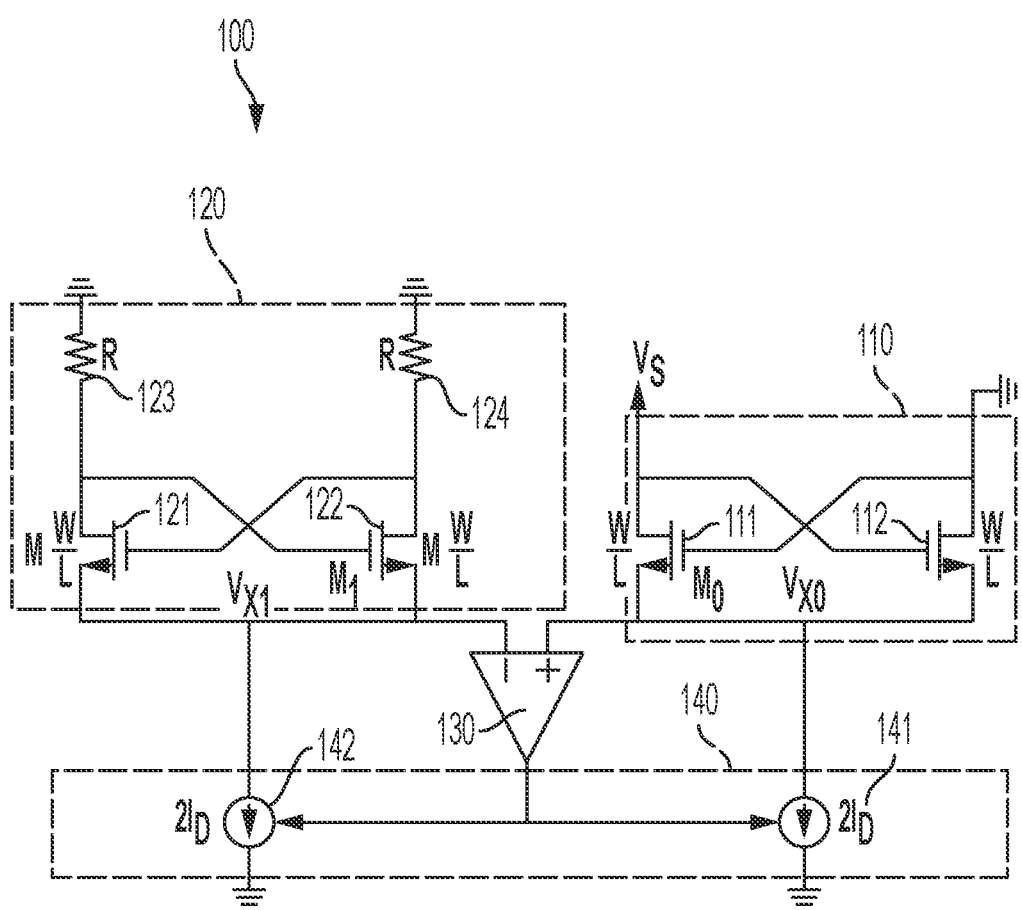
FIG. 3 shows an example of a negative resistance circuit, according to some embodiments.

FIG. 3 shows an example of a negative resistance circuit 100, according to some embodiments. Negative resistance circuit 100 includes a first cross-coupled transistor circuit 110, a second cross-coupled transistor circuit 120, an op-amp 130 and a current source circuit 140.

The first cross-coupled transistor circuit 110 may be connected to the inverting input of the op-amp of FIG. 1, also referred to as the summing node $V_S$. The first cross-coupled transistor circuit 110 may be connected to the non-inverting input of op-amp 130 at terminal $V_{X0}$. The first cross-coupled transistor circuit 110 includes a transistor 111 having its source connected to terminal $V_{X0}$ and its drain connected to the summing node Vs. The first cross-coupled transistor circuit 110 also includes a transistor 112 having its source connected to terminal $V_{X0}$ and its drain connected to a ground terminal. Transistors 111 and 112 have a channel width W and a length L, with a ratio W/L. As illustrated in FIG. 3, transistors 111 and 112 are cross-coupled, with the gate of one transistor being connected to the drain of the other transistor. More specifically, transistor 111 has its gate connected to the drain of transistor 112 and transistor 112 has its gate connected to the drain of transistor 111. A biasing current is provided to the first cross-coupled transistor circuit 110 by current source 141, which is controlled by the output of op-amp 130. In some embodiments, the first cross-coupled transistor circuit 110 may be biased using constant-$G_m$ biasing. The first-cross coupled transistor circuit 110 may be biased in strong inversion or in weak inversion.

The second cross-coupled transistor circuit 120 may be connected to the inverting input of op-amp 130 at terminal $V_{X1}$. The second cross-coupled transistor circuit 120 includes a transistor 121 having its source connected to terminal $V_{X1}$ and its drain connected to the impedance 123. The second cross-coupled transistor circuit 120 also includes a transistor 122 having its source connected to terminal $V_{X1}$ and its drain connected to the impedance 124. Transistors 121 and 122 have a channel width to length ratio of M times W/L. As illustrated in FIG. 3, transistors 121 and 122 are cross-coupled, with the gate of one transistor being connected to the drain of the other transistor. More specifically, transistor 121 has its gate connected to the drain of transistor 122 and transistor 122 has its gate connected to the drain of transistor 121. A biasing current is provided to the first cross-coupled transistor circuit 120 by current source 142, which is controlled by the output of op-amp 130. In some embodiments, the second cross-coupled transistor circuit 120 may be biased using constant-$G_m$ biasing. The second cross-coupled transistor circuit 120 may be biased in strong inversion or in weak inversion.

Op-amp 130 maintains $V_{X1}$ and $V_{X0}$ at the same voltage. The output of op-amp 130 controls the current sources 142 and 141. Accordingly, the negative resistance circuit 100 maintains its (small signal) resistance and is sensitive to PVT variations.

Although FIG. 3 shows a single ended version of a negative resistance circuit 100, a differential version of the negative resistance circuit may be used. For example, instead of connecting the drain of transistor 112 to a ground terminal, a differential signal may be provided across the drains of transistors 111 and 112.

Figure 4:
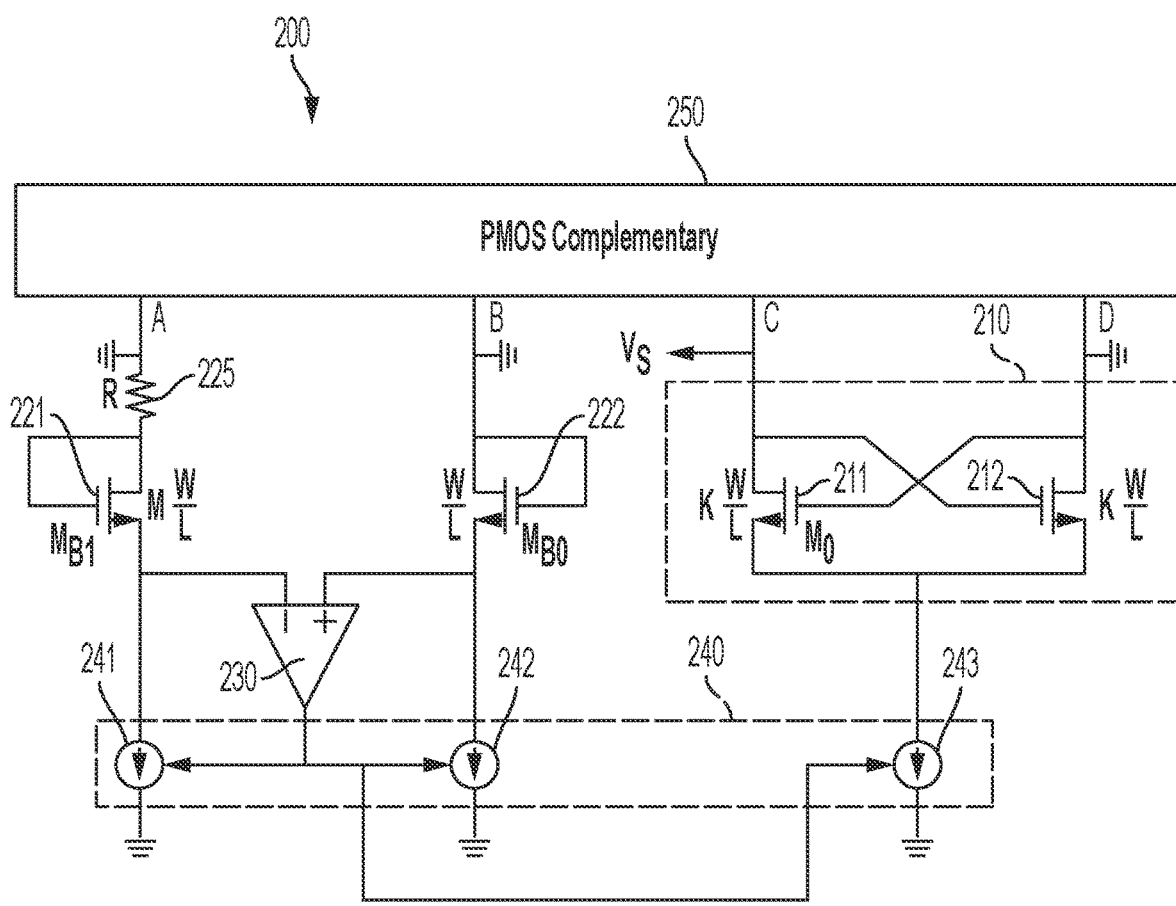
FIG. 4 shows an example of a negative resistance circuit using diode-connected transistors, according to some embodiments.

FIG. 4 shows another example of a negative resistance circuit 200, according to some embodiments. An op-amp 230 has its inverting input connected to the source of transistor 221 and its non-inverting input connected to the source of transistor 222. Transistors 221 and 222 are each diode connected: their gate is connected to their drain. Transistor 222 has a width to length ratio of W/L. Transistor 221 has a width to length ratio of M times W/L. The op-amp 230 holds the sources of transistors 221 and 222 at the same voltage. Transistor 221 is biased by a current source 241, which is controlled by the output of the op-amp 230. Transistor 222 is biased by a current source 242, which is controlled by the output of the op-amp 230. Transistor 221 is in series with an impedance 225. Impedance 225 may be connected between the drain of transistor 225 and ground. The drain of transistor 222 may be coupled to ground. The transistors 221 and 222 may form a diode-connected replica bias circuit that provides constant constant-$G_m$ biasing. Such a replica bias circuit may have the advantage of low power consumption. Another advance is that the feedback loop for the constant-$G_m$ biasing can be isolated from the main feedback loop.

A cross-coupled transistor circuit 210 may be connected to the inverting input of the op-amp of FIG. 1, also referred to as the summing node $V_S$. The cross-coupled transistor circuit 210 includes a transistor 211 having its source connected to current source 243 and its drain connected to the summing node $V_S$. The first cross-coupled transistor circuit 210 also includes a transistor 212 having its source connected to current source 243 and its drain connected to a ground terminal. Transistors 211 and 212 each has a channel width to length ratio of K times W/L. As illustrated in FIG. 4, transistors 211 and 212 are cross-coupled, with the gate of one transistor being connected to the drain of the other transistor. More specifically, transistor 211 has its gate connected to the drain of transistor 212 and transistor 212 has its gate connected to the drain of transistor 211. A biasing current is provided to the cross-coupled transistor circuit 210 by current source 243, which is controlled by the output of op-amp 230. In some embodiments, the cross-coupled transistor circuit 210 may be biased using constant-$G_m$ biasing. The cross-coupled transistor circuit 210 may be biased in strong inversion or in weak inversion.

Figure 5:
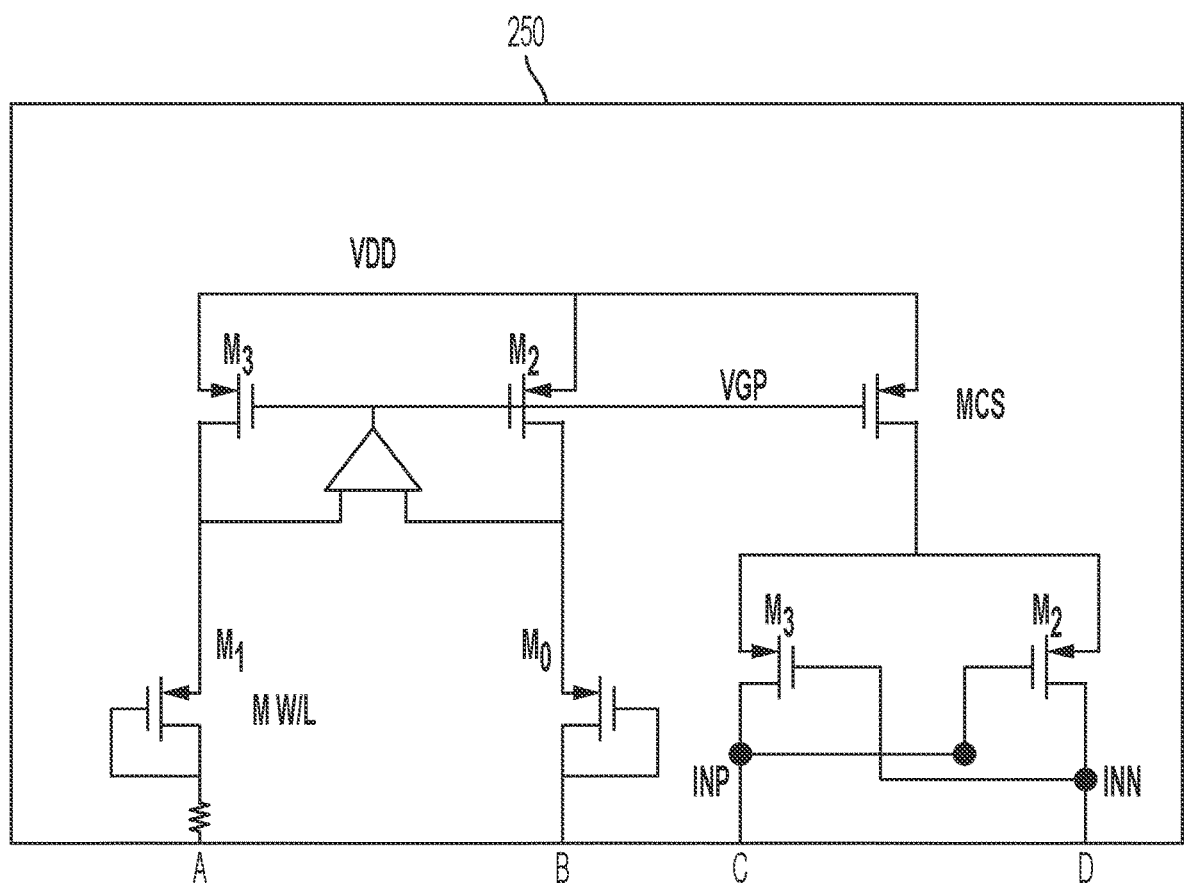
FIG. 5 shows an example of a complementary PMOS circuit, according to some embodiments.

An optional PMOS complementary circuit 250 may be included. Circuit 250 may enhance the overall Gm of the cross-coupled transistors 211 and 212. NMOS transistors can sink current and PMOS transsitors can push current. Gm will be double for the same current if a PMOS device is also included. FIG. 5 shows an example of a PMOS complementary circuit 250. If INN is connected to ground, INP sees an input impedance of −1/Gm assuming Gmp=Gmn=Gm. Points A, B, C and D in FIG. 5 may connected to the corresponding points in FIGS. 4 and 6.

Figure 6:
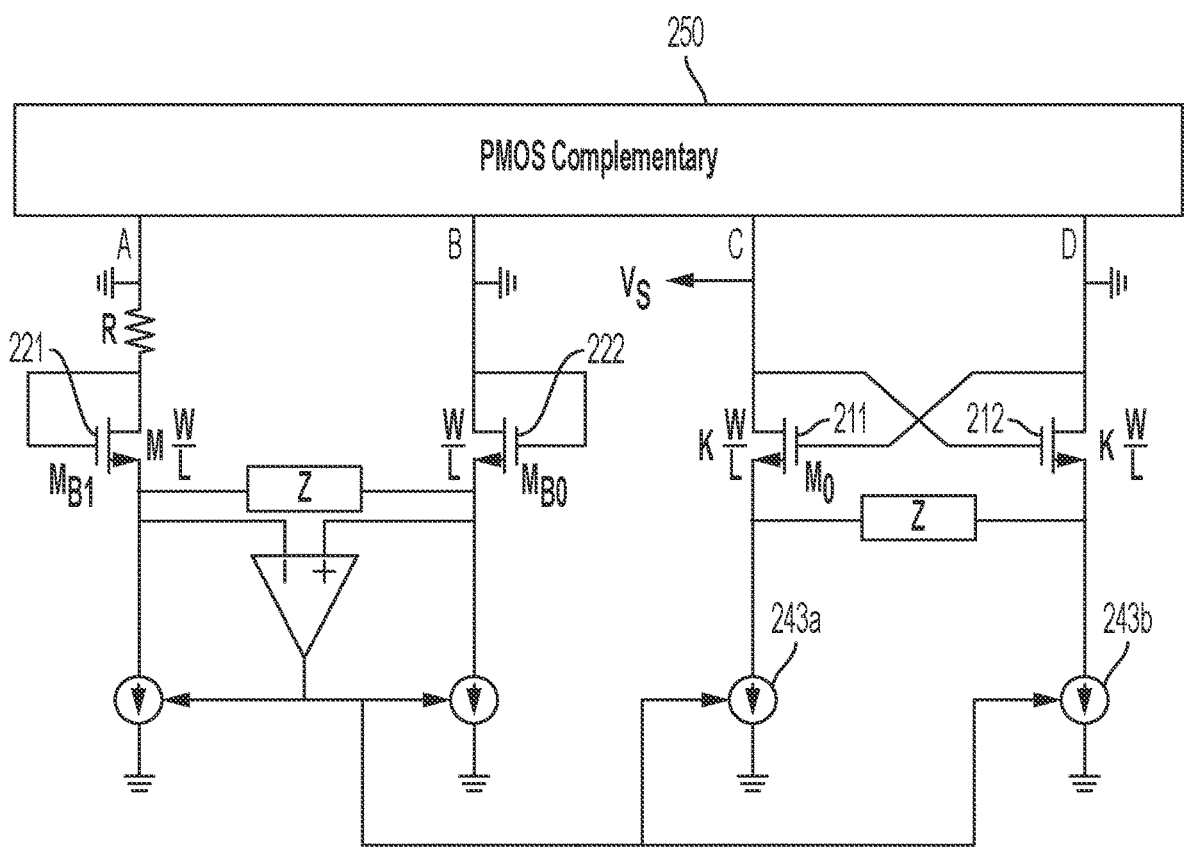
FIG. 6 shows an example of a negative resistance circuit using diode-connected transistors and explicit impedances Z, according to some embodiments.

FIG. 6 illustrates that optionally, an explicit impedance Z may be connected between the sources of transistors 211 and 212 and/or between the sources of transistors 221 and 222. If the sources of transistors 211 and 212 are separated by an impedance Z the current source 243 may be split into two separate current sources 243a and 243b for biasing transistors 211 and 212, respectively.

Additional Aspects

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A circuit, comprising:
a first operational amplifier having an inverting input and a non-inverting input;
a negative resistance circuit connected to the inverting input of the first operational amplifier, the negative resistance circuit comprising:
a second operational amplifier;
a current source controlled by the second operational amplifier; and
a cross-coupled transistor circuit having at least one transistor biased by a current produced by the current source.

2. The circuit of claim 1, wherein the at least one transistor has a source connected to a non-inverting input of the second operational amplifier.

3. The circuit of claim 1, wherein the cross-coupled transistor circuit comprises:
a first transistor; and
a second transistor,
wherein a gate of the first transistor is connected to a drain of the second transistor and a gate of the second transistor is connected to a drain of the first transistor.

4. The circuit of claim 3, wherein a source of the first transistor and a source of the second transistor are connected to a non-inverting input of the second operational amplifier.

5. The circuit of claim 4, wherein the first transistor has a drain connected to the inverting input of the first operational amplifier and the second transistor has a drain connected to a ground terminal or a differential input.

6. The circuit of claim 5, further comprising a second cross-coupled transistor circuit having at least one transistor biased by a current produced by a second current source, the second current source being controlled by the second operational amplifier.

7. The circuit of claim 6, wherein the second cross-coupled transistor circuit comprises:
a third transistor; and
a fourth transistor,
wherein a gate of the third transistor is connected to a drain of the fourth transistor and a gate of the fourth transistor is connected to a drain of the third transistor.

8. The circuit of claim 7, wherein a source of the third transistor and a source of the fourth transistor are connected to a non-inverting input of the second operational amplifier.

9. The circuit of claim 8, further comprising a first impedance coupled between the third transistor and ground, and a second impedance coupled between the fourth transistor and ground.

10. The circuit of claim 1, further comprising:
a first transistor having its source connected to an inverting input of the second operational amplifier; and
a second transistor having its source connected to a non-inverting input of the second operational amplifier,
wherein the first and second transistors each have their gate connected to their drain.

11. The circuit of claim 10, further comprising:
a third current source controlled by the second operational amplifier and biasing the first transistor; and
a fourth current source controlled by the second operational amplifier and biasing the second transistor.

12. The circuit of claim 11, further comprising an impedance coupled between the first transistor and a ground terminal.

13. The circuit of claim 12, wherein the second transistor has its drain connected to a ground terminal.

14. The circuit of claim 13, having an impedance connected between the sources of the first and second transistors.

15. A negative resistance circuit, comprising:
an operational amplifier;
a current source controlled by the operational amplifier; and a cross-coupled transistor circuit having at least one transistor biased by a current produced by the current source.

16. The negative resistance circuit of claim 15, wherein the at least one transistor has a source connected to a non-inverting input of the operational amplifier.

17. The negative resistance circuit of claim 15, wherein the cross-coupled transistor circuit comprises:
- a first transistor; and
- a second transistor,
- wherein a gate of the first transistor is connected to a drain of the second transistor and a gate of the second transistor is connected to a drain of the first transistor.

18. The negative resistance circuit of claim 17, wherein a source of the first transistor and a source of the second transistor are connected to a non-inverting input of the operational amplifier.

19. The negative resistance circuit of claim 15, further comprising:
- a first transistor having its source connected to an inverting input of the operational amplifier; and
- a second transistor having its source connected to a non-inverting input of the operational amplifier,
- wherein the first and second transistors each have their gate connected to their drain.

20. The negative resistance circuit of claim 19, further comprising:
- a third current source controlled by the operational amplifier and biasing the first transistor; and
- a fourth current source controlled by the operational amplifier and biasing the second transistor.

* * * * *